(12) United States Patent
Mrugalla

(10) Patent No.: US 10,666,491 B2
(45) Date of Patent: May 26, 2020

(54) SIGNAL IMBALANCE DETECTION SYSTEMS AND METHODS

(71) Applicant: Intel IP Corporation, Santa Clara, CA (US)

(72) Inventor: Florian Mrugalla, Munich (DE)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/144,092

(22) Filed: Sep. 27, 2018

(65) Prior Publication Data

US 2020/0106657 A1    Apr. 2, 2020

(51) Int. Cl.
*H04L 27/38* (2006.01)

(52) U.S. Cl.
CPC ................. *H04L 27/3863* (2013.01)

(58) Field of Classification Search
CPC .. H03D 3/008; H03D 3/009; H04L 25/03019; H04L 27/364; H04L 27/3863
See application file for complete search history.

(56) References Cited

U.S. PATENT DOCUMENTS

| | | | | |
|---|---|---|---|---|
| 5,848,099 A | * | 12/1998 | Benner | H04B 17/21 375/226 |
| 6,535,560 B1 | * | 3/2003 | Masenten | H03D 3/008 329/308 |
| 6,748,028 B1 | * | 6/2004 | Torre | H03D 1/00 348/E5.113 |
| 2004/0082300 A1 | * | 4/2004 | Scheck | H03D 3/009 455/126 |
| 2007/0165745 A1 | * | 7/2007 | Fonden | H03F 1/3247 375/297 |

* cited by examiner

*Primary Examiner* — Khanh C Tran
(74) *Attorney, Agent, or Firm* — Eschweiler & Potashnik, LLC

(57) ABSTRACT

In a communication device and corresponding methods to determine a phase offset imbalance, an input signal (e.g. oscillator signal) is phase shifted to generate a set of phase-shifted values. The set of phased-shifted values and the input signal are mixed to generate a respective set of mixed signals. The phase offset imbalance (e.g. phase error) is calculated based on the set of mixed signals and a gradient value.

24 Claims, 9 Drawing Sheets

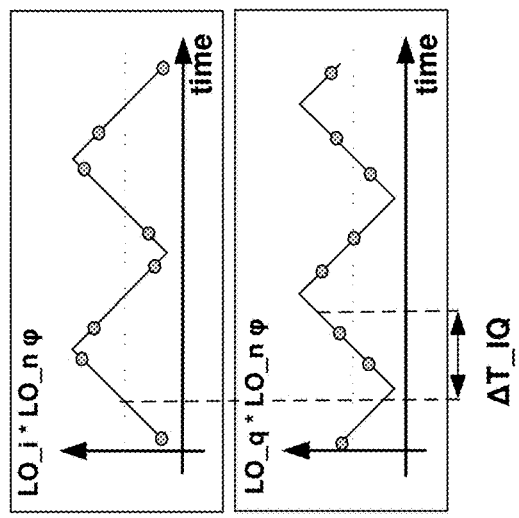
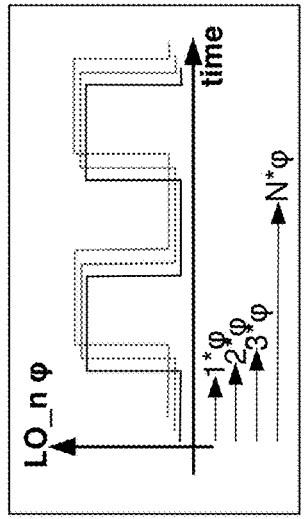
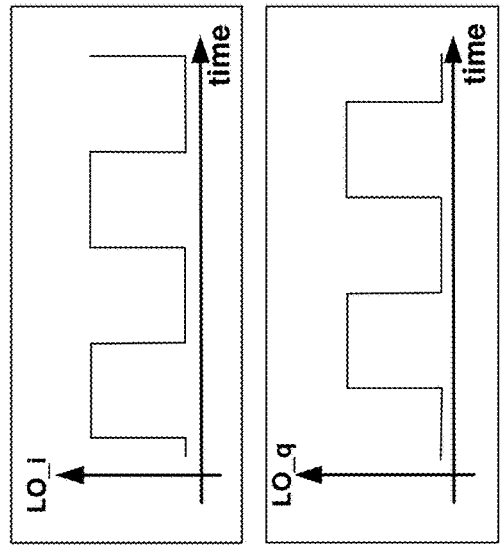
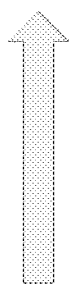
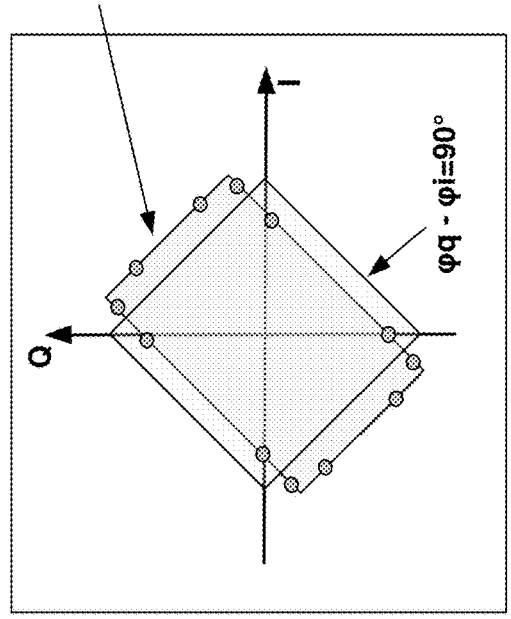

SIGNAL IMBALANCE DETECTION SYSTEMS AND METHODS

BACKGROUND

Field

Aspects described herein generally relate to methods and systems to detect and reduce signal imbalance for demodulation operations of a communication signal, including signal imbalances between in-phase (I) and quadrature (Q) components of the communication signal.

Related Art

Wireless communications are expanding into communications having increased data rates that require high precision demodulation to provide increased signal integrity. In quadrature modulation systems, a down conversion that produces full signal integrity, a perfect 90° alignment between Q and I signals derived from a local oscillator is required. For example, a slight mismatch of 1° may limit the image rejection. Therefore a more complex calibration of I and Q mismatch is required.

BRIEF DESCRIPTION OF THE DRAWINGS/FIGURES

The accompanying drawings, which are incorporated herein and form a part of the specification, illustrate the aspects of the present disclosure and, together with the description, further serve to explain the principles of the aspects and to enable a person skilled in the pertinent art to make and use the aspects.

FIGS. 5A-5D illustrate a phase shifting and mixing process according to exemplary aspects of the present disclosure.

The exemplary aspects of the present disclosure will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the aspects of the present disclosure. However, it will be apparent to those skilled in the art that the aspects, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

Aspects described herein generally relate to demodulation systems and methods that provide increased signal integrity for modulation/demodulation processes based on a fixed phase offset value (e.g. 90°). Conventionally, systems employed a pure single tone calibration signal that may be generated with an external signal generator or with the on chip transmitter that may suffer from an imbalance as well. In these examples, chip transmitter uses quadrature modulator principle which might heavily limit the quality of signal calibration.

Aspects provide quadrature modulation systems in which a mixing (e.g. down or up conversion) produces full signal integrity with a 90° alignment between Q and I signals. The aspects of the present disclosure will be described with reference to wireless systems employing quadrature modulation/demodulation, but the present disclosure is not limited thereto and aspects are applicable to any communication system in which 90° phase shifts are implemented as would be understood by one of ordinary skill in the art. Further, aspects are described with reference to demodulation of a received signal within a receiver, but are not limited thereto, and aspects are also applicable to modulation system (e.g. within a transmitter).

Figure 2:
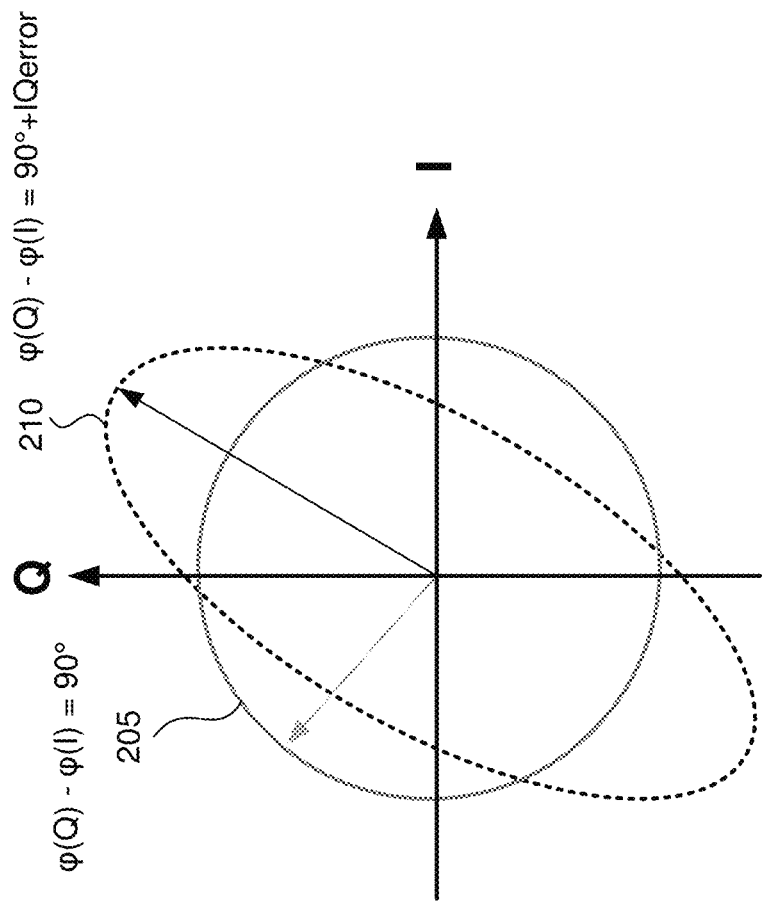
FIG. 2 illustrates examples of an error-free signal and a signal having a phase imbalance.

To provide increased signal integrity, systems and methods of the present disclosure are directed to signal (e.g. I/Q) offset imbalance processing to provide 90° alignment between the signals (e.g. between I and Q). The signal offset imbalance processing can include one or more imbalance calculation operations and/or one or more imbalance offset correction operations. Advantageously, by providing 90° alignment, interference from one signal (e.g. I) on the offset signal (e.g. Q) is reduced or negated. With reference to FIG. 2, the signal can be depicted as vector rotating through the constellation diagram. When the signal does not include an offset imbalance, the resulting signal takes the shape of a circle. If the signal includes an offset imbalance, the resulting signal takes a non-circular shape, such as an ellipse.

In operation, an on-chip local oscillator (LO) signal may be impacted by an IQ-Imbalance. In one or more aspects, a signal copy generated out of I and Q signals is phase shifted, down converted and measured. This measurement is repeated N times with different phase shift values, where the full range of phase shift is used to create a full rotation through the constellation diagram. The resulting data points (constellation figure) can then be mathematically processed which allows the calculation of the IQ Imbalance error.

Advantageously, aspects do not require any external equipment. Further, aspects can be configured to perform online calibration (e.g. during breaks of normal operation) which allows error tracking vs. one or more environmental characteristics (e.g. temperature, lifetime). Additionally, the imbalance calculator advantageously does not require large chip area.

The aspects herein are applicable to both transmitter and receiver implementations, and can be understood as a measurement procedure for quadrature signals, but is not limited thereto.

Figure 1:
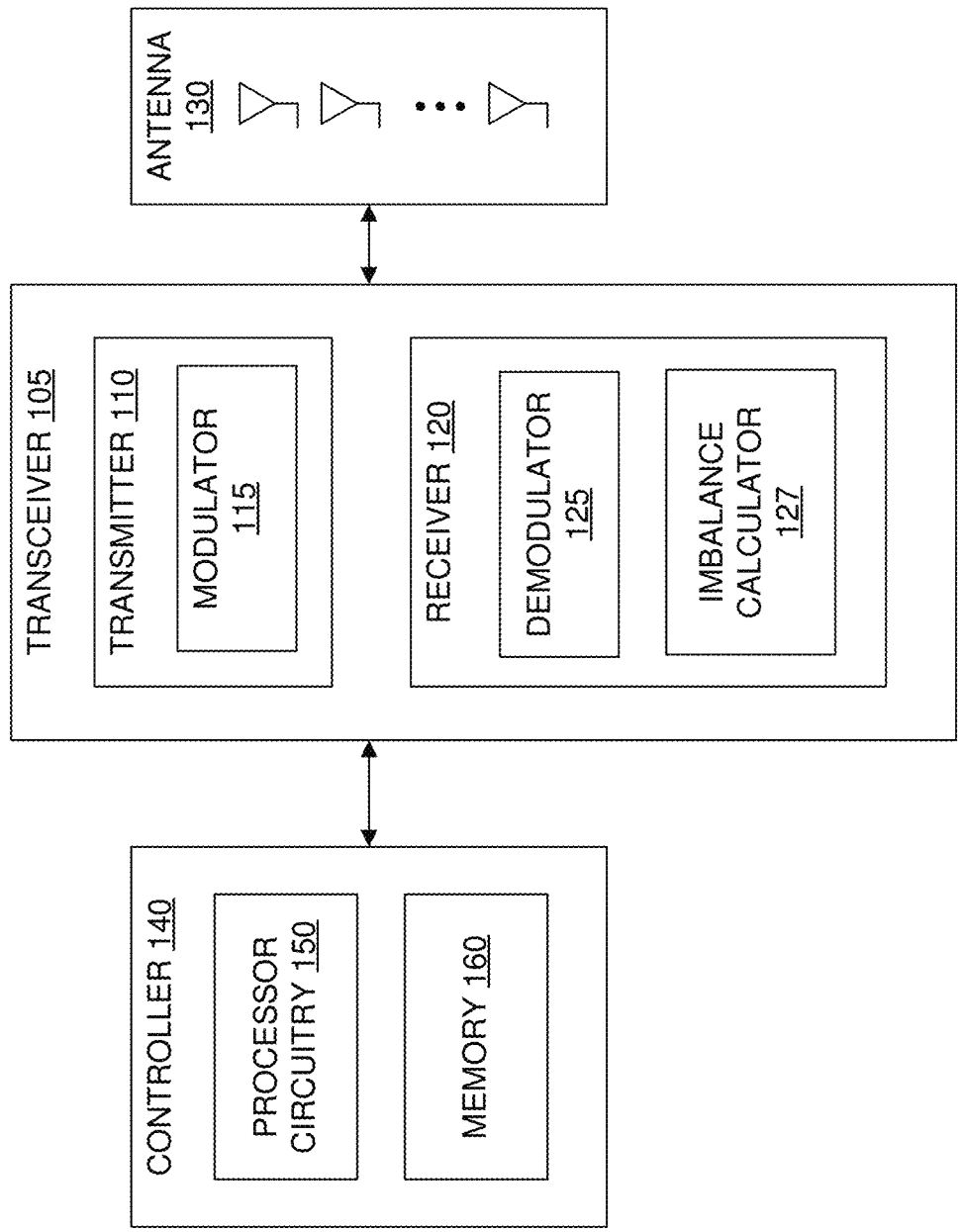
FIG. 1 illustrates a communication device according to an exemplary aspect of the present disclosure.

FIG. 1 illustrates a communication device 100 according to an exemplary aspect of the present disclosure. The communication device 100 is configured to transmit and/or receive wireless communications via one or more wireless technologies. For example, the communication device 100 can be configured for wireless communications conforming to, for example, one or more fifth generation (5G) cellular communication protocols, such as 5G protocols that use the 28 GHz frequency spectrum, and/or communication protocols conforming to the Wireless Gigabit Alliance (WiGig) standard, such as IEEE 802.11ad and/or IEEE 802.11ay that use the 60 GHz frequency spectrum. The communication device 100 is not limited to these communication protocols and can be configured for one or more additional or alternative communication protocols, such as one or more 3rd Generation Partnership Project's (3GPP) protocols (e.g., Long-Term Evolution (LTE)), one or more wireless local area networking (WLAN) communication protocols, and/or one or more other communication protocols as would be understood by one of ordinary skill in the relevant arts. For example, the communication device 100 can be configured to transmit and/or receive wireless communications using one or more communication protocols that utilize the millimeter wave (mmWave) spectrum (e.g., 24 GHz-300 GHz), such as WiGig (IEEE 802.11ad and/or IEEE 802.11ay) which operates at 60 GHz, and/or one or more 5G protocols using, for example, the 28 GHz frequency spectrum.

The communication device 100 can be configured to communicate with one or more other communication devices, including, for example, one or more base stations, one or more access points, one or more other communication devices, and/or one or more other devices as would be understood by one of ordinary skill in the relevant arts.

In an exemplary aspect, the communication device 100 includes a controller 140 communicatively coupled to one or more transceivers 105.

The transceiver(s) 105 is configured to transmit and/or receive wireless communications via one or more wireless technologies. In an exemplary aspect, the transceiver 105 includes processor circuitry that is configured for transmitting and/or receiving wireless communications conforming to one or more wireless protocols.

In an exemplary aspect, the transceiver 105 includes a transmitter 110 and a receiver 120 configured for transmitting and receiving wireless communications, respectively, via one or more antennas 130. In aspects having two or more transceivers 105, the two or more transceivers 105 can have their own antenna 130, or can share a common antenna via a duplexer. In an exemplary aspect, the transceiver 105 (including the transmitter 110 and/or receiver 120) is configured to perform one or more baseband processing functions (e.g., media access control (MAC), encoding/decoding, modulation/demodulation, data symbol mapping; error correction, etc.).

In an exemplary aspect, the transmitter 110 is configured to perform one or more modulation operations, such as quadrature modulation operations (e.g. modulate in-phase and quadrature phase components to generate a transmission signal). The transmitter 110 is not limited to performing quadrature modulation operations and can be configured to modulate signals using one or more other modulation technics as would be understood by one of ordinary skill in the art.

In an exemplary aspect, the transmitter 110 includes a modulator 115 that is configured to modulate an input signal to generate a modulated output signal. The modulator 115 can be configured to modulate the input signal using one or more modulation techniques (e.g. quadrature modulation) as would be understood by one of ordinary skill in the art. In an exemplary aspect, the modulator 115 includes processor circuitry that is configured to module the input signal to generate the modulated signal.

In an exemplary aspect, the receiver 120 is configured to perform one or more demodulation operations, such as quadrature demodulation operations (e.g. demodulate in-phase and quadrature phase components of a received signal). The receiver 120 is not limited to performing quadrature demodulation operations and can be configured to demodulate signals using one or more other demodulation technics as would be understood by one of ordinary skill in the art. In an exemplary aspect, the receiver 120 includes processor circuitry that is configured to perform one or more operations and/or functions of the receiver 120.

In an exemplary aspect, the receiver 120 includes a demodulator 125 that is configured to demodulate an input signal to generate a demodulated output signal. The demodulator 125 can be configured to demodulate the input signal using one or more modulation techniques (e.g. quadrature demodulation) as would be understood by one of ordinary skill in the art. In an exemplary aspect, the modulator 115 includes processor circuitry that is configured to module the input signal to generate the modulated signal.

In an exemplary aspect, the receiver 120 includes a phase offset imbalance calculator 127 that is configured to perform signal offset imbalance processing, which can include one or more phase offset imbalance calculation operations and/or one or more phase offset imbalance correction operations to correct or otherwise compensate for a phase imbalance. In one or more aspects, the transmitter 110 can alternatively or additionally include a phase offset imbalance calculator 127.

In an exemplary aspect, the phase offset imbalance calculator 127 includes processor circuitry that is configured to perform one or more operations and/or functions of the phase offset imbalance calculator, including signal offset imbalance processing. In aspects directed to quadrature modulation/demodulation, the phase offset imbalance calculator 127 can be referred to as IQ phase offset imbalance calculator, IQ imbalance calculator, or IQ imbalance processor.

The antenna 130 can be a single antenna, include multiple antennas, or include one or more antenna elements forming an integer array of antenna elements. In an exemplary aspect, the antenna 130 is a phased array antenna that includes multiple radiating elements (antenna elements) each having a corresponding phase shifter. The antenna 130 configured as a phased array antenna can be configured to perform one or more beamforming and/or beam-scanning operations. The beamforming operations can include generating beams formed by shifting the phase of the signal emitted from each radiating element to provide constructive/destructive interference so as to steer the beams in the desired direction.

In an exemplary aspect, the controller 140 includes processor circuitry 150 that is configured to control the overall operation of the communication device 100, such as the operation of the transceiver(s) 105. The processor circuitry 150 may be configured to control the transmitting and/or receiving of wireless communications via the transceiver(s) 105 and/or control phase shifting and/or amplifier gain values associated with antenna elements of the antenna 130.

In an exemplary aspect, the processor circuitry 150 is configured to perform one or more baseband processing functions (e.g., media access control (MAC), encoding/decoding, modulation/demodulation, data symbol mapping;

error correction, etc.) in cooperation with the transceiver 105 or instead of such operations/functions being performed by the transceiver 105. The processor circuitry 150 is configured to run one or more applications and/or operating systems; power management (e.g., battery control and monitoring); display settings; volume control; and/or user interactions via one or more user interfaces (e.g., keyboard, touchscreen display, microphone, speaker, etc.) in one or more aspects.

In an exemplary aspect, the controller 140 further includes a memory 160 that stores data and/or instructions, where when the instructions are executed by the processor circuitry 150, controls the processor circuitry 150 to perform the functions described herein.

The memory 160 may be any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory 160 can be non-removable or removable, or a combination of both.

Examples of the communication device 100 include (but are not limited to) a mobile computing device (mobile device)—such as a laptop computer, a tablet computer, a mobile telephone or smartphone, a "phablet," a personal digital assistant (PDA), and mobile media player; a wearable computing device—such as a computerized wrist watch or "smart" watch, and computerized eyeglasses; and/or internet-of-things (IoT) device. In some aspects of the present disclosure, the communication device 100 may be a stationary communication device, including, for example, a stationary computing device—such as a personal computer (PC), a desktop computer, television, smart-home device, security device (e.g., electronic/smart lock), automated teller machine, a computerized kiosk, and/or an automotive/aeronautical/maritime in-dash computer terminal.

In one or more aspects, the communication device 100 or one or more components of the communication device 100 is additionally or alternatively configured to perform digital signal processing (e.g., using a digital signal processor (DSP)), modulation and/or demodulation (using a modulator/demodulator), a digital-to-analog conversion (DAC) and/or an analog-to-digital conversion (ADC) (using a respective DA and AD converter), an encoding/decoding (e.g., using encoders/decoders having convolution, tail-biting convolution, turbo, Viterbi, and/or Low Density Parity Check (LDPC) encoder/decoder functionality), frequency conversion (using, for example, mixers, local oscillators, and filters), Fast-Fourier Transform (FFT), precoding, and/or constellation mapping/de-mapping to transmit and/or receive wireless communications conforming to one or more wireless protocols and/or facilitate the beamforming scanning operations and/or beamforming communication operations.

Figure 3A:
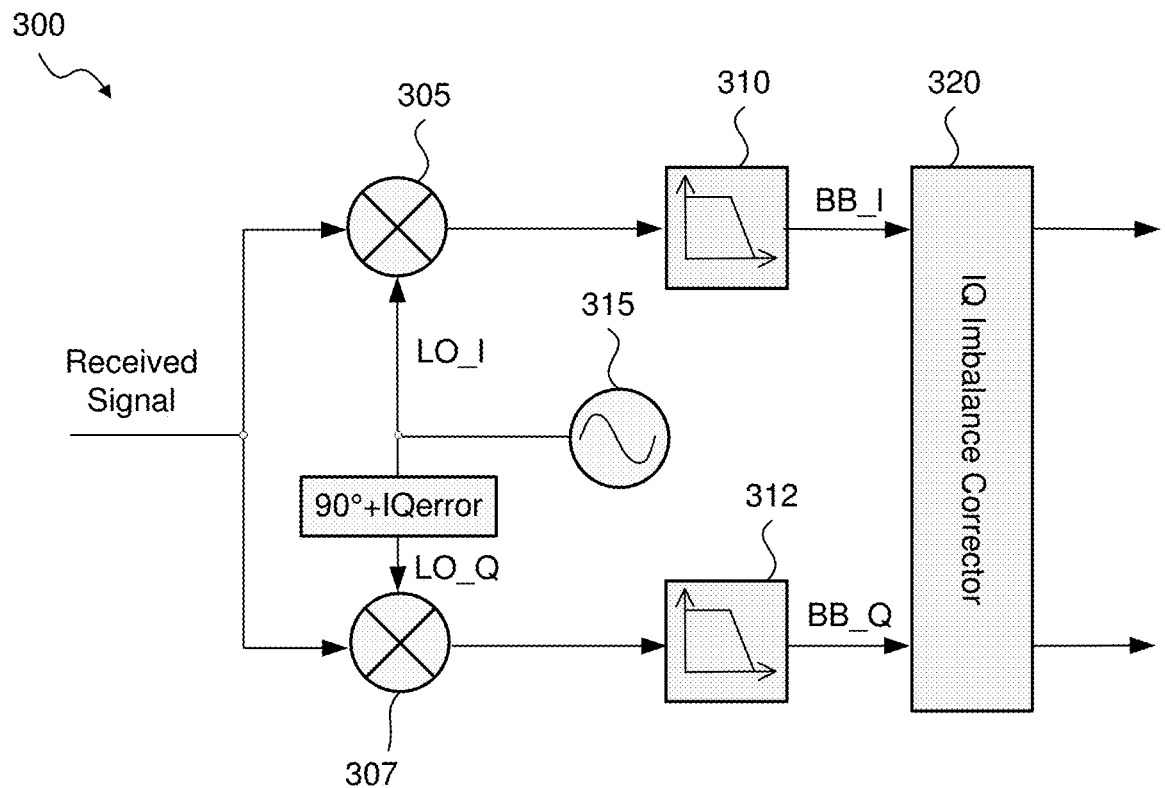
FIG. 3A illustrates a demodulator according to an exemplary aspect of the present disclosure.

FIG. 3A illustrates an example demodulator 300. The demodulator 300 can be implemented in receiver 120 to demodulate a received signal. The demodulator 300 can include mixers 305 and 307 respectively coupled to filters 310 and 312. The output of the filters 310, 312 are provided to IQ Imbalance Corrector 320. The mixer 305 mixes a received signal with an I-component local oscillator signal generated by local oscillator (LO) 315 to generate a mixed output signal, which is provided to filter 310. The mixer 307 mixes the received signal with a Q-component local oscillator signal generated by the LO 315 to generate a mixed output signal, which is provided to filter 312. The filters 310 and 312 generate respective filtered signals, which are then provided to IQ imbalance calculator 320. The LO signal provided to the mixers 305, 307 may be derived from a phase locked loop (PLL). In this example, the Q-component local oscillator signal (i.e. the Q signal) is approximately 90° phase shifted compared to the I signal (i.e. I-component local oscillator signal). In operation, the 90° phase shift may vary over process, temperature, and lifetime, resulting in a phase offset error referred to as IQerror in FIG. 3A.

If the value of IQerror is known, the IQ imbalance calculator 320 is configured to correct the impact of the IQerror on the filtered signals after down conversion. In an example, the IQ Imbalance Correction includes one or more digital signal post processing operations to remove or otherwise compensate for the IQerror.

Figure 3B:
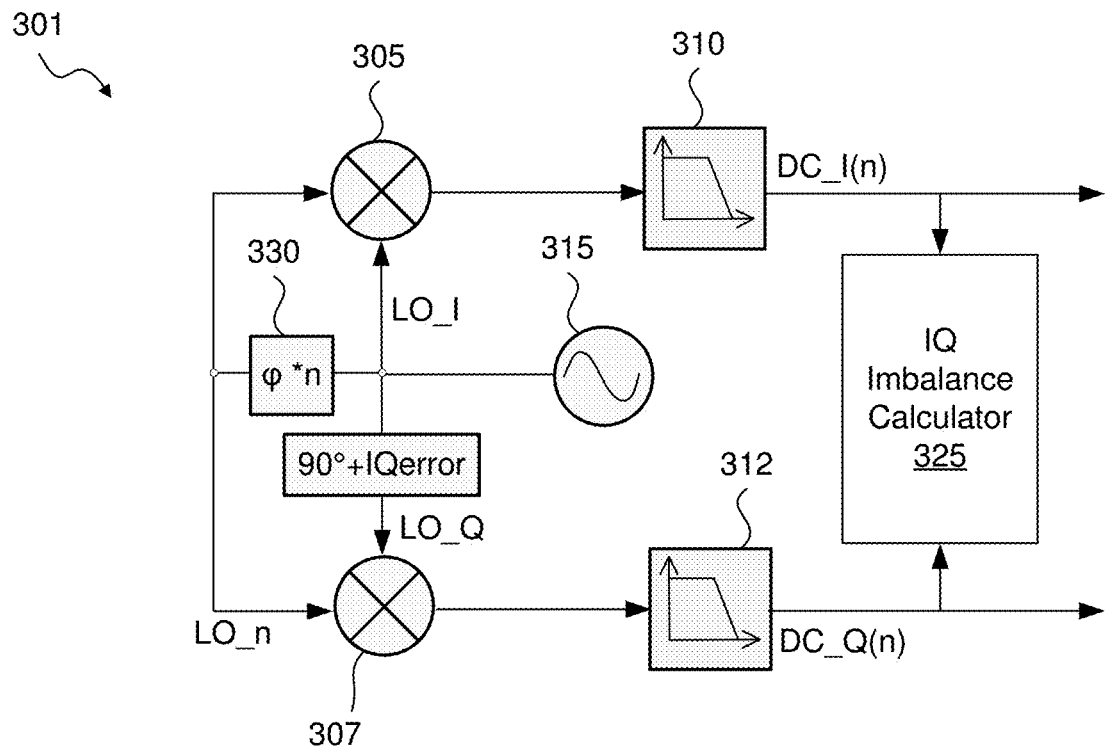
FIG. 3B illustrates a demodulator according to an exemplary aspect of the present disclosure.

FIG. 3B illustrates a demodulator 301 according to an exemplary aspect of the present disclosure. In an exemplary aspect, the receiver includes the demodulator 301 to demodulate a signal received by the receiver 120 via the antenna 130.

In an exemplary aspect, the demodulator 301 includes mixers 305, 307, filters 310, 312, local oscillator (LO) 315, IQ Imbalance calculator 325, and phase shifter 330. The mixers 305 and 307 are respectively coupled to filters 310 and 312. The output of the filters 310, 312 are provided to one or other components of the receiver 120 and/or provided as an output of the receiver 120 within the transceiver 105 (and/or as an output of the transceiver 105).

In an exemplary aspect, the demodulator 301 is configured to selectively connect to an input of the receiver 110 in a first mode of operation and to the phase shifter 330 in a second mode of operation. In the first mode of operation, the input to the mixers 305, 307 receive an input signal to the demodulator 301 similar to the configuration illustrated in FIG. 3A. For example, the mixer 305 mixes the received signal with the I-component local oscillator signal generated by local oscillator (LO) 315 to generate a mixed output signal, which is provided to filter 310. The mixer 307 mixes the received signal with a Q-component local oscillator signal generated by the LO 315 to generate a mixed output signal, which is provided to filter 312. The filters 310 and 312 are configured to filter an input signal to generate respective filtered signals. In an exemplary aspect, in the first mode of operation, the IQ imbalance calculator 325 is disabled, powered off, or otherwise controlled to enter a reduced-power mode. Additionally or alternatively, the IQ imbalance calculator 325 is disconnected from output signal paths of the filters 310, 312. The LO signal provided to the mixers 305, 307 may be derived from a phase locked loop (PLL).

In an exemplary aspect, in the second mode of operation, the output of the phase shifter 330 is provided to the mixers 305, 307. In an exemplary aspect, in this configuration, the mixers 305 and 307 are disconnected from the input of the receiver 110 and connected to the phase shifter 330. In the first mode of operation, the phase shifter 330 is disconnected from the mixers 305, 307 and/or is disabled, powered off, or otherwise controlled to enter a reduced-power mode.

In the second mode of operation, the mixers 305 and 307 are configured to mix the output signal (e.g. phase shifted signal) from the phase shifter 330 with the I-Component and Q-component signals of the output signal of the LO 315, respectively. For example, the mixer 305 mixes the phase shifted signal with the I-component local oscillator signal generated by local oscillator (LO) 315 to generate a mixed output signal, which is provided to filter 310. The mixer 307 mixes the phase shifted signal with a Q-component local oscillator signal generated by the LO 315 to generate a mixed output signal, which is provided to filter 312. The filters 310 and 312 generate respective filtered signals.

In an exemplary aspect, the phase shifter 330 is configured to generate N phase-shifted signals having different phase shifted values, where N is an integer and N≥2. In an exemplary aspect, each of the N generated phase-shifted signals are n multiples of a phase-shift value φ (i.e. multiples of n*φ). For example, if N=10, the phase shifter 330 is configured to generate n*p phase shifted signals: {1*φ; 2*φ; 3*φ; 4*φ; 5*φ; 6*φ; 7*φ; 8*φ; 9*φ; 10*φ}. Although this example includes the value of "n" having an integer value, the value is not limited to integer values.

Figure 8:
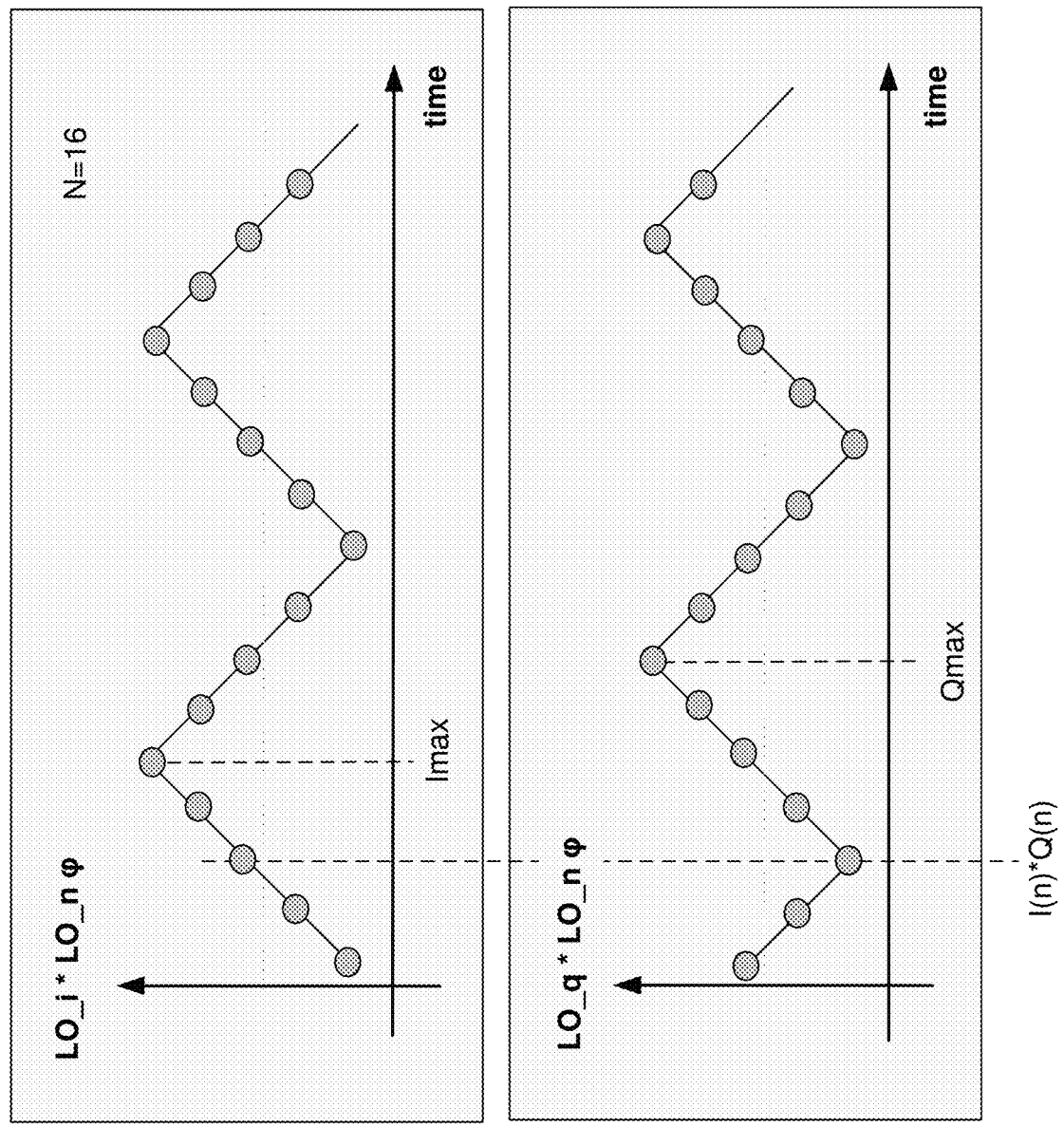
FIG. 8 illustrates mixed output signals according to an exemplary aspect of the present disclosure.

In an exemplary aspect, the IQ Imbalance calculator 325 is configured to perform signal offset imbalance processing, which can include one or more phase offset imbalance calculation operations and/or one or more phase offset imbalance correction operations. The IQ imbalance calculator 325 is configured to determine phase offset information based on the phase shifted signals (e.g. set of N (n*φ) signals) to determine the offset error (e.g. IQerror) between the I and Q components of the LO signal. In an exemplary aspect, as shown in FIGS. 5 and 8 and discussed in more detail below, the phase offset information is the DC signal component of the LO signal at each of the n*φ phase values of the LO signal.

In an exemplary aspect, the IQ imbalance calculator 325 includes one or more analog-to-digital converters (ADCs) that are configured to convert the filtered output signals from the filters 310, 312 to corresponding digital signals, which are then further processed by the IQ imbalance calculator 325.

Figure 4:
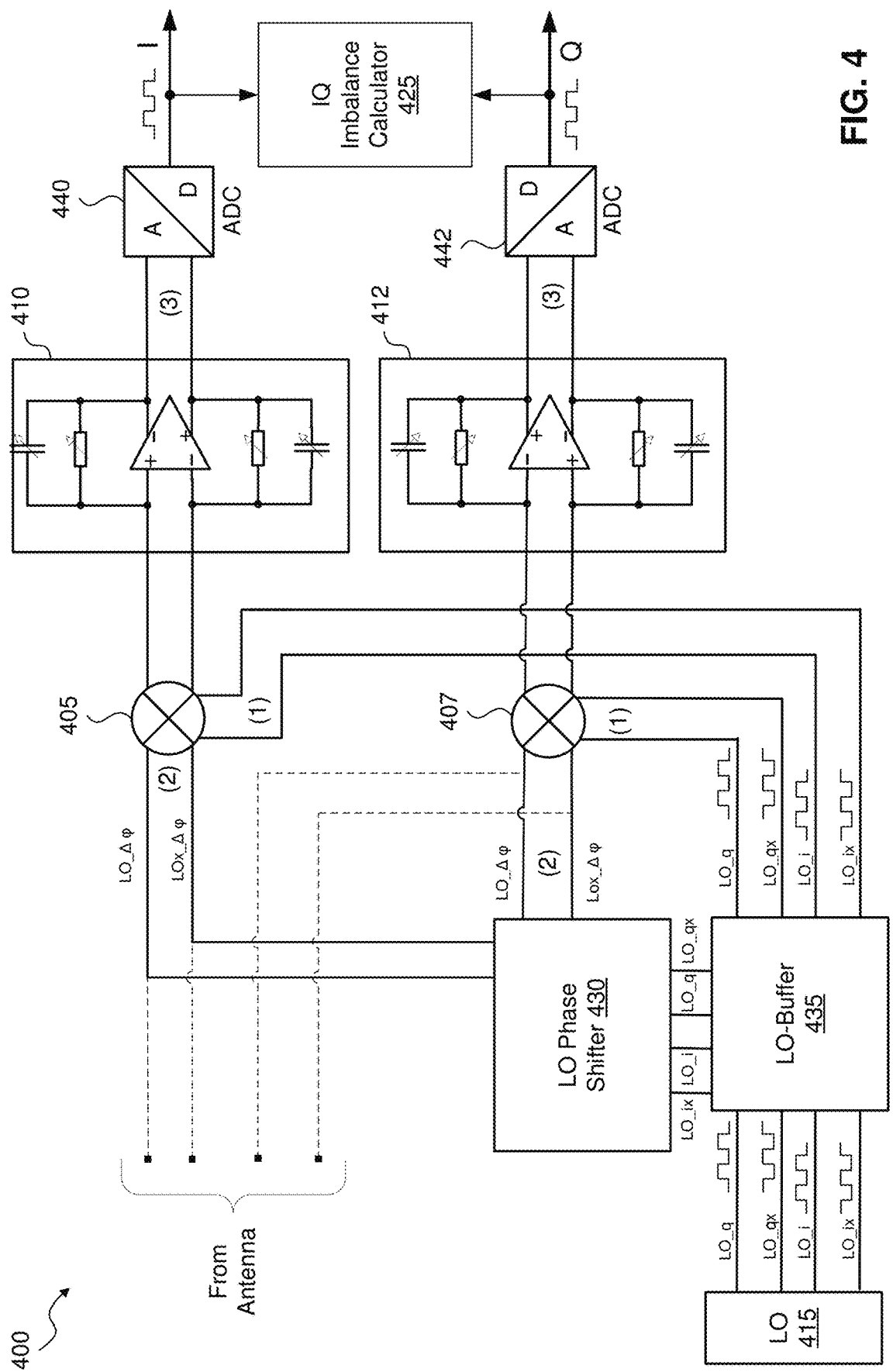
FIG. 4 illustrates a demodulator according to an exemplary aspect of the present disclosure.

FIG. 4 illustrates a demodulator 400 according to an exemplary aspect of the present disclosure. The demodulator 400 is an exemplary aspect of the demodulator 301. In an exemplary aspect, the receiver includes the demodulator 400 to demodulate a signal received by the receiver 120 via the antenna 130.

In an exemplary aspect, the demodulator 400 includes mixers 405, 407, filters 410, 412, local oscillator (LO) 415, IQ Imbalance calculator 425, phase shifter 430, buffer 435, and analog-to-digital converters (ADCs) 440, 442. The mixers 405 and 407 are respectively coupled to filters 410 and 412. The output of the filters 410, 412 are provided to one or other components of the receiver 120 and/or provided as an output of the receiver 120 within the transceiver 105 (and/or as an output of the transceiver 105).

In an exemplary aspect, the demodulator 400 is configured to selectively connect to an input of the receiver 110 (e.g. from the antenna) in a first mode of operation and to the phase shifter 430 in a second mode of operation. The second mode of operation is illustrated in FIG. 4.

In the first mode of operation, the input to the mixers 405, 407 receive an input signal to the demodulator 400 similar to the configuration illustrated in FIG. 3A. For example, the mixer 405 mixes the received signal with the I-component local oscillator signal generated by local oscillator (LO) 415 to generate a mixed output signal, which is provided to filter 410. The mixer 407 mixes the received signal with a Q-component local oscillator signal generated by the LO 415 to generate a mixed output signal, which is provided to filter 412. The filters 410 and 412 are configured to filter an input signal to generate respective filtered signals. In an exemplary aspect, the filters 410, 412 can include one or more variable or static capacitors, one or more variable or static resistors, one or more amplifiers (e.g. op-amps), and/or one or more other circuit components (e.g. inductors) as would be understood by one of ordinary skill in the art.

In an exemplary aspect, in the first mode of operation, the IQ imbalance calculator 425 and/or phase shifter 430 are disabled, powered off, or otherwise controlled to enter a reduced-power mode. Additionally or alternatively, the IQ imbalance calculator 425 and/or phase shifter 430 are disconnected from one or more other components of the demodulator 400 when the demodulator 400 is operating in the first mode of operation.

In an exemplary aspect, the LO 415 generates I-component LO signal (LO_i), an inverse of the I-component LO signal (LO_ix), Q-component LO signal (LO_q), and an inverse of the Q-component LO signal (LO_qx). The signals LO LO_ix, LO_q, and LO_qx are provided to the buffer 435 from the LO 415. The buffer 435 is configured to buffer the signals and provide the buffered signals to the mixers 405 and 407. For example, LO_i and LO_ix are provided to the mixer 405, and LO_q, and LO_qx are provided to the mixer 407.

In an exemplary aspect, in the second mode of operation, the signals LO_i, LO_ix, LO_q, and LO_qx are also provided to the phase shifter 430. In an exemplary aspect, the mixers 405 and 407 are disconnected from the input of the receiver 110 and connected to the phase shifter 430. This disconnected configuration is illustrated by dashed signal paths in FIG. 4.

In the second mode of operation, the mixers 405 and 407 are configured receive: (1) the I-Component signals LO_i, LO_ix, and the Q-component signals LO_q, LO_qx, respectively, from the buffer 435; and (2) the phase-shifted signals LO_Δφ and LOx_Δφ from the phase shifter 430. The mixers 405 and 407 then mix the received signals to generate a mixed output signal. In an exemplary aspect, the mixers 405 and 407 down-mix the phase shifted signals based on the LO signals. The mixed output signals are then provided to filters 410 and 412, respectively. The filters 410 and 412 generate respective filtered signals (i.e. signals (3) in FIG. 4).

The analog filtered signals can then be converted by ADC 440, 442 to generate corresponding digital signals I and Q, which are provided to the IQ imbalance calculator 425. Although aspects include square wave signals, the present disclosure is not limited to square wave signals.

In an exemplary aspect, the phase shifter 430 is configured to generate N phase-shifted signals having different phase shifted values, where N is an integer and N≥2. In an exemplary aspect, each of the N generated phase-shifted signals are n-multiples of a phase-shift value φ (i.e. multiples of n*φ). For example, if N=10, the phase shifter 430 is configured to generate n*φ phase shifted signals: {1*φ; 2*φ; 3*φ; 4*φ; 5*φ; 6*φ; 7*φ; 8*φ; 9*φ; 10*9}. Although this example includes the value of "n" having an integer value, the value is not limited to integer values.

In an exemplary aspect, the IQ Imbalance calculator 425 is configured to perform signal offset imbalance processing, which can include one or more phase offset imbalance calculation operations and/or one or more phase offset imbalance correction operations. The IQ imbalance calculator 425 is configured to determine phase offset information based on the phase shifted signals (e.g. set of N (n*φ) signals) to determine the offset error (e.g. IQerror) between the I and Q components of the LO signal. In an exemplary aspect, the phase offset information is the DC signal component of the LO signal at each of the n*φ phase values of the LO signal. In an exemplary aspect, the IQ Imbalance calculator 425 includes processor circuitry that is configured to perform signal offset imbalance processing.

FIGS. 5A-D illustrate the phase shifting operations according to an exemplary aspect of the present disclosure.

In FIG. 5A, the I component LO signal (LO_i) and the Q-component LO signal (LO_q) are illustrated. FIG. 5B illustrates the set of N (n*φ) phase shifted signals generated by the phase shifter 430. In an exemplary aspect, the mixers 405 and 407 mix (e.g. multiply) the I-component LO signal (LO_i) and the Q component LO signal (LO_q), respectively, with the set of N (n*φ) phase shifted signals generated by the phase shifter 430. That is, FIG. 5A represents a first input to the mixers 405, 407 and FIG. 5B represents the second input to the mixers 405, 407. FIG. 5C illustrates the respective mixed signals output from the mixers 405, 407.

The different phase shifts of the set of N (n*φ) phase shifted signals in FIG. 5B are shown as a black signal curve followed by subsequently shifted signals as grey signal curves. In total there will be N curves, each shifted equivalent to n*φ.

In an exemplary aspect, each of the phase shifted signals of the set of N (n*φ) phase shifted signals is fed into the mixers 405, 407 and down converted by the I-component LO signal (LO_i) and the Q-component LO signal (LO_q). In an exemplary aspect, the mixed output signal of the mixers 405, 407 include: (1) a DC signal component and (2) a signal component on 2×LO$_{frequency}$. In operation, the filters 401, 412 (e.g. active low pass filters) are configured to filter out the signal components on 2×LO$_{frequency}$. Therefore, the signal components (e.g. the signal components on 2× LO$_{frequency}$) are removed (or substantially removed) from the mixed output signal to thereby leave only the DC component. This phase shifting and mixing procedure is repeated N times for each phase shift n*φ.

FIG. 5C illustrates the DC signal component vs. the phase shift values (e.g. 1*φ, 2*φ, 3*φ ... N*φ). The yellow points indicate one DC signal value of I and Q mixer output signal for each applied phase shift n*φ. In this example, the triangular DC signal curves are a result of the convolution of two square wave signals (e.g. LO_i and LO_q). In an exemplary aspect, the phase shifter 430 is configured to perform the convolutional shift.

In an exemplary aspect, the DC signal curves are depicted as a complex IQ plane as shown in FIG. 5D. In this example, the two triangular signal I/Q curves form a closed rectangular shape. A full RF phase shift of N*φ≥360° would be represented by a full rotation around the envelope of the rectangle.

In an exemplary aspect, the phase shifter 430 is configured to generate N phase steps such that a DC signal curve extends a full rotation of ≥360° to calculate the IQ imbalance error (e.g. IQerror). As shown in FIG. 5D, if there is no IQ imbalance error, the rectangle will be quadratic (e.g. while form a square). If there is an IQ imbalance error, curve forms a rectangular shape.

In an exemplary aspect, the shape of the IQ curve within the complex IQ plane is a cross correlation between the two triangular I and Q signals. In an exemplary aspect, the cross correlation ($C_{IQ}$) satisfies the following equations:

$$C_{IQ}(\epsilon) = \frac{1}{T} \int_{-180°}^{180°} TRI_I(\tau) TRI_Q(\tau + \epsilon) d\tau$$

$$C_{IQ}(\epsilon) = \int_{-T/2}^{T/2} \frac{I(\tau) Q(\tau + \epsilon)}{T \cdot I_{max} \cdot Q_{max}} d\tau$$

Where τ is time, ε is IQ imbalance error, $I_{max}$ is the maximum I-component value, $Q_{max}$ is the maximum Q-component value, and $TRI_I$ and $TRI_Q$ are triangular functions of the I and Q components, respectively. In this example, the two triangular signals are represented by I or Q folded with the phase shifted signal.

In an exemplary aspect, because the area of a triangular function is equivalent to one, cross correlation ($C_{IQ}$) includes the I and Q outputs being divided by their respective maximum values. In operation, a cross correlation of I and Q with a 90° phase difference would result in a cross correlation ($C_{IQ}$) having a zero value. If a phase imbalance is present between I and Q that is unequal to +/−90° (or multiples thereof), the cross correlation ($C_{IQ}$) will have a non-zero value.

Figure 6:
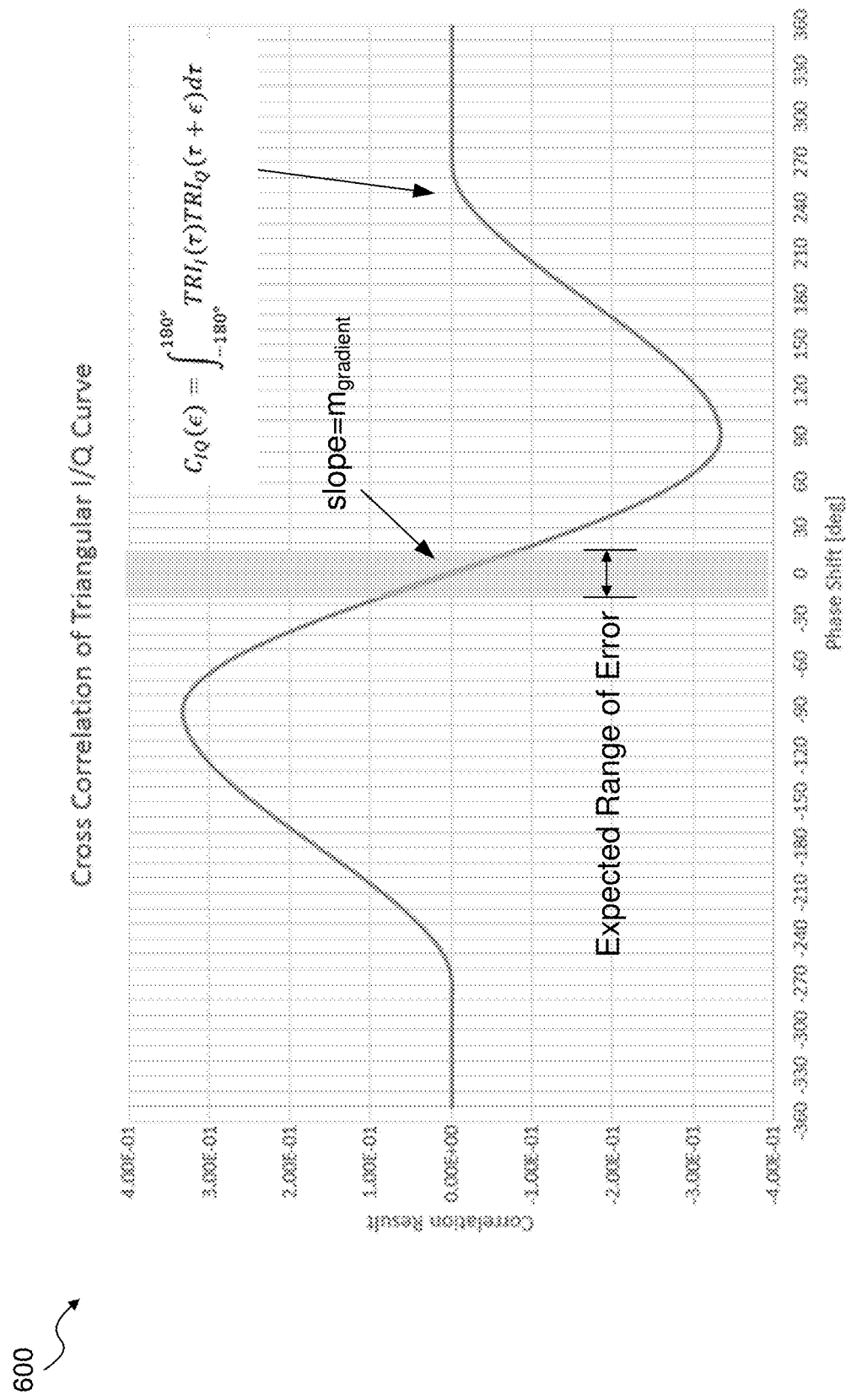
FIG. 6 illustrates a cross correlation signal according to an exemplary aspect of the present disclosure.

FIG. 6 illustrates a cross correlation 600 of I and Q triangular functions according to an exemplary aspect. In this example, for a 0° error, the correlation result is 0. For a −90° error, the correlation is at its maximum while for a 90° error, the correlation is at its minimum value. In an exemplary aspect, the IQ Imbalance calibration is assumed to be within a +/−15° error range (grey section shown in FIG. 6). In this example, the slope is calculated around 0°, which corresponds to the $M_{gradient}$ in the present disclosure. The slope is the error range is shown in yellow.

Figure 7:
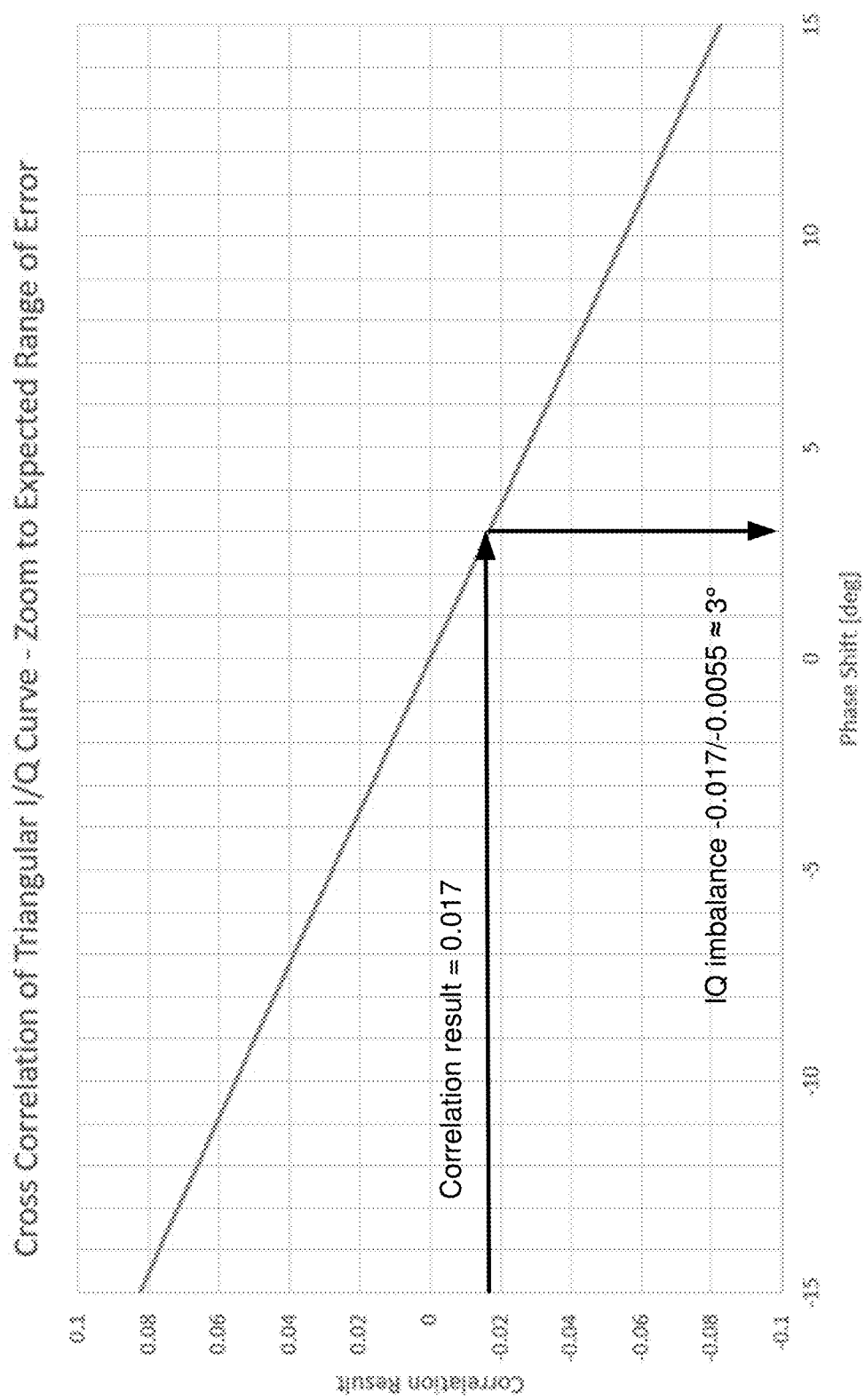
FIG. 7 illustrates a cross correlation signal according to an exemplary aspect of the present disclosure.

FIG. 7 illustrates an enlarged portion 700 of the cross correlation 600 according to an exemplary aspect of the present disclosure. In this example, the enlarged portion is the assumed error range (i.e. +/−15°). In an exemplary aspect, the $M_{gradient}$ is predetermined and has a value of −0.0055, but is not limited thereto. The $M_{gradient}$ can be determined from one or more simulations (e.g. MATLAB simulations).

FIG. 8 illustrates I and Q curves and the measurement thereof according to an exemplary aspect of the present disclosure. In this example, the phase shifter 430 is configured to determine 16 phase shift values (i.e. N=16) with respect to the DC components of the I and Q curves. The 16 phase steps form a full 360° rotation. In an exemplary aspect, the cross correlation (i.e. $C(IQph_{err})$) is determined according to the following equation:

$$C(IQph_{err}) = \sum_{n=1}^{N} \frac{I(n) \cdot Q(n)}{N \cdot Imax \cdot Qmax}$$

Where $IQph_{err}$ is the IQ imbalance error value, I(n) and Q(n) correspond to the DC component values of the respective I and Q signals, N is the total number of DC samples (e.g. measurement points), n is a single measurement point, and Imax and Qmax correspond to the maximum I and Q values, respectively. In this example, $IQph_{err}$ is an error value (e.g. due to hardware inaccuracies).

In an exemplary aspect, the IQ imbalance ($IQph_{err}$) is determined based on the $M_{gradient}$. For example, the correlation ($C(IQph_{err})$) is divided by the $M_{gradient}$ as shown in the following equation:

$$IQph_{err} = \frac{C(IQph_{err})}{M_{gradient}}$$

Where $IQph_{err}$ is the IQ balance error value (e.g. IQerror), $C(IQph_{err})$ is the correlation value, and $M_{gradient}$ is the slope of the correlation of the I and Q signals. In an exemplary aspect, $M_{gradient}$ is a scalar value that is derived from the results of the cross correlation ($C_{IQ}$) or is technology or hardware dependent value that is predetermined (e.g. through calibration or other measurements).

In this example, with reference to FIG. 7, the $C(IQph_{err})$ represents the Y-axis value of the graph. Dividing the cross correlation result by the $M_{gradient}$ calculates the IQ imbalance error. For example, as shown in FIG. 7, if the correlation result is calculated to be −0.017, the IQ imbalance (IQerror) is calculated as 3° by dividing the correlation result by the $M_{gradient}$ (i.e. −0.017/−0.0055=3).

In an exemplary aspect, the IQ Imbalance calculator 425 is configured to cross correlate the I and Q mixed output signals to determine the cross correlation of the I and Q mixed output signals (e.g. $C(IQph_{err})$). The IQ Imbalance calculator 425 is also configured to divide the cross correlation result by the $M_{gradient}$ to calculate the IQ imbalance (IQerror). In an exemplary aspect, the IQ Imbalance calculator 425 is configured to determine the gradient value $M_{gradient}$.

Figure 9:
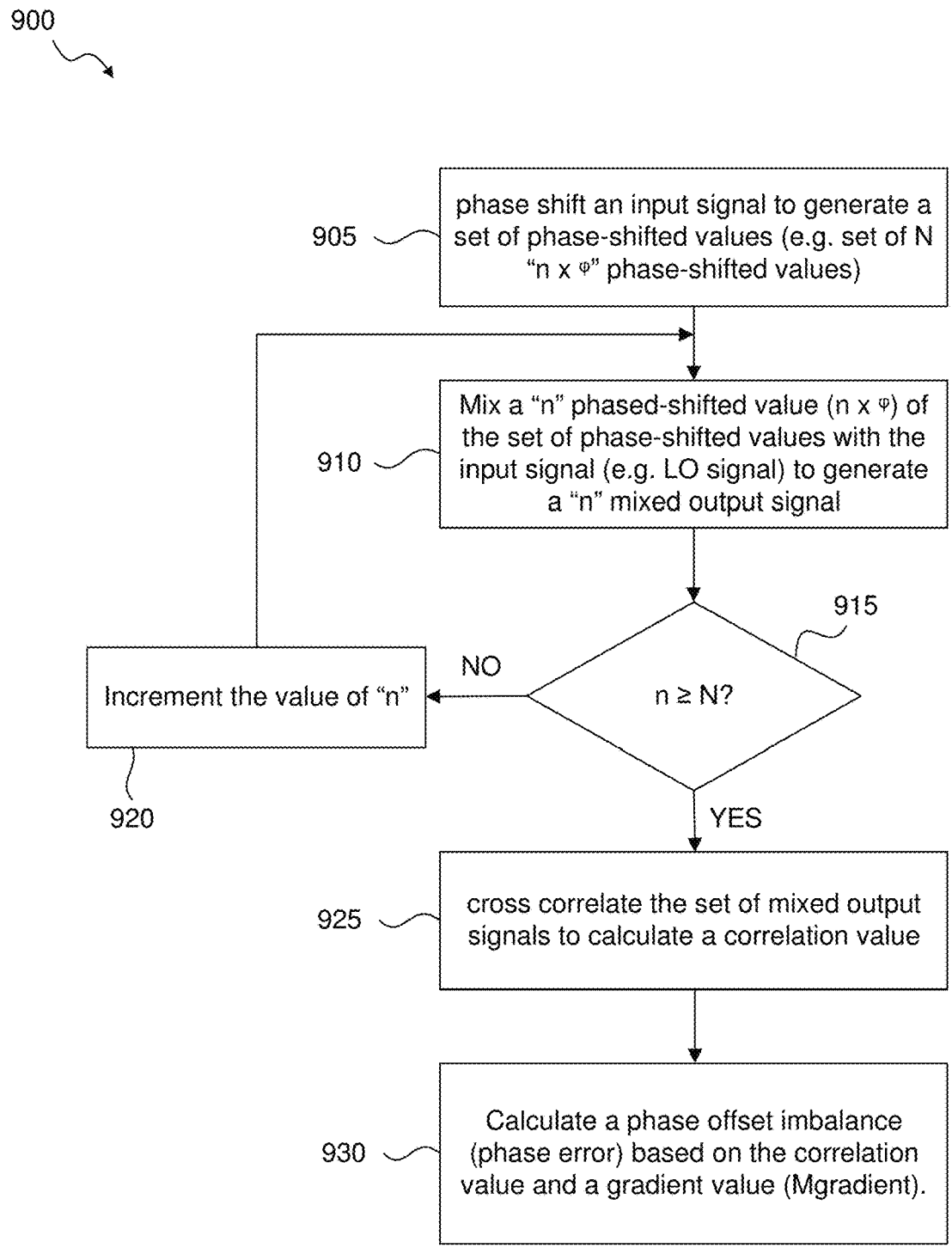
FIG. 9 illustrates a flowchart of a phase offset imbalance calculation method according to an exemplary aspect of the present disclosure.

FIG. 9 illustrates a flowchart 900 of a phase offset imbalance calculation method according to an exemplary aspect of the present disclosure. The flowchart 900 is described with continued reference to FIGS. 1-8. The operations of the methods are not limited to the order described below, and the various operations may be performed in a different order. Further, two or more operations of the methods may be performed simultaneously with each other. In an exemplary aspect, the mobile device 100 (e.g. including the demodulator 400) is configured to perform the method of flowchart 900.

The method of flowchart 900 begins at operation 905, where an input signal is phase shifted to generate a set of phase-shifted values (e.g. set of N "n×φ" phase-shifted values). In an exemplary aspect, the phase shifter 430 is configured to generate N phase-shifted signals having different phase shifted values, where N is an integer and N≥2. In an exemplary aspect, each of the N generated phase-shifted signals are n-multiples of a phase-shift value φ (i.e. multiples of n*φ). For example, if N=10, the phase shifter 430 is configured to generate n*φ phase shifted signals: {1*φ; 2*φ; 3*φ; 4*φ; 5*φ; 6*φ; 7*φ; 8*φ; 9*φ; 10*φ}. Although this example includes the value of "n" having an integer value, the value is not limited to integer values.

After operation 905, the flowchart 900 transitions to operation 910, where a "n" phased-shifted value (n×φ) of the set of phase-shifted values is mixed with the input signal (e.g. LO signal) to generate a "n" mixed output signal. In an exemplary aspect, the phase shifted signal of the set of N (n*φ) phase shifted signals is fed into the mixers 405, 407 and mixed (e.g. down converted) by the I-component LO signal (LO_i) and the Q-component LO signal (LO_q). After operation 910, the flowchart 900 transitions to operation 915, where it is determined if additional phase-shifted values of the N set of values are to be mixed with the input signal (i.e. n≤N), the flowchart 900 transitions to operation 920, where the value if n is incremented. The flowchart 900 then returns to operation 910 where the next phased-shifted value is mixed with the input signal. Otherwise, the flowchart 900 transitions to operation 925. With the operations 910, 915, and 920, each of the phase shifted signals of the set of N (n*φ) phase shifted signals are mixed with the input signal (e.g. the I-component LO signal (LO_i) and the Q-component LO signal (LO_q)) to mix the set of N set of N (n*φ) phase shifted signals with the input signal.

At operation 925, the I and Q mixed output signals are cross correlated to generate a cross correlation value. In an exemplary aspect, the I and Q mixed output signals are first filtered (e.g. by filters 410, 412), and the filter values are cross correlated.

In an exemplary aspect, the IQ Imbalance calculator 425 is configured to cross correlate the I and Q mixed output signals (or the filtered versions of these signals) to determine the cross correlation of the I and Q mixed output signals (e.g. $C(IQph_{err})$).

After operation 925, the flowchart 900 transitions to operation 930, where phase offset imbalance (e.g. IQerror) is calculated based on the cross correlation and the gradient value $M_{gradient}$. The IQ Imbalance calculator 425 is configured to divide the cross correlation result by the $M_{gradient}$ to calculate the IQ imbalance (IQerror).

EXAMPLES

Example 1 is a phase error detection method, comprising: phase shifting an input signal to generate a set of phase-shifted values; mixing the set of phased-shifted values and the input signal to generate a respective set of mixed signals; and calculating a phase error based on the set of mixed signals and a gradient value.

Example 2 is the subject matter of Example 1, wherein phase shifting the input signal comprises phase shifting the input signal by multiples of a phase shift value to generate the set of phase-shifted signals.

Example 3 is the subject matter of any of Examples 1-2, wherein mixing the set of phased-shifted signals and the input signal comprises multiplying each phase-shifted value of the set of phase-shifted values by the input signal to generate respective mixed signal values that form the set of mixed signals set of mixed signals.

Example 4 is the subject matter of any of Examples 1-3, wherein the mixing comprises down converting the set of phase-shifted values by the input signal.

Example 5 is the subject matter of any of Examples 1-4, further comprising cross correlating the input signal to determine a cross correlation signal.

Example 6 is the subject matter of Example 5, wherein the gradient value is a slope of the cross correlation signal.

Example 7 is the subject matter of Example 5, wherein the cross correlating the input signal comprises: performing a triangular function on the input signal to generate a triangular value; and cross correlating the triangular value to generate the cross correlation signal.

Example 8 is the subject matter of Example 7, wherein the input signal is a quadrature modulated signal having an in-phase (I) component and an in-quadrature (Q) component, the performing the triangular function on the input signal including determining a triangular function on the I component and a triangular function on the Q component to generate the triangular value.

Example 9 is the subject matter of any of Examples 1-4, wherein the gradient value is a slope of a cross correlation of the input signal.

Example 10 is the subject matter of Example 9, wherein the input signal is a quadrature modulated signal having an in-phase (I) component and an in-quadrature (Q) component, the cross correlation of the input signal comprising cross correlating a triangular function of the I component with a triangular function of the Q component.

Example 11 is the subject matter of any of Examples 1-10, wherein the input signal is a quadrature modulated signal having an in-phase (I) component and an in-quadrature (Q) component.

Example 12 is a non-transitory computer-readable storage medium with an executable program stored thereon, when executed, causes a processor to perform the operations of any of Examples 1-11.

Example 13 is a demodulator comprising: a phase shifter configured to phase shift an input signal to generate a set of phase-shifted values; a mixer configured to mix the set of phased-shifted values and the input signal to generate a respective set of mixed signals; and an imbalance calculator configured to calculate a phase error based on the set of mixed signals and a gradient value.

Example 14 is the subject matter of Example 13, wherein phase shifter is configured to phase shift the input signal by multiples of a phase shift value to generate the set of phase-shifted signals.

Example 15 is the subject matter of any of Examples 13-14, wherein the mixer is configured to multiply each phase-shifted value of the set of phase-shifted values by the input signal to generate respective mixed signal values that form the set of mixed signals set of mixed signals.

Example 16 is the subject matter of any of Examples 13-15, wherein the mixing comprises down converting the set of phase-shifted values by the input signal.

Example 17 is the subject matter of any of Examples 13-16, wherein the imbalance calculator is further configured to cross correlate the input signal to determine a cross correlation signal.

Example 18 is the subject matter of Example 17, wherein the gradient value is a slope of the cross correlation signal.

Example 19 is the subject matter of Example 17, wherein, to cross correlate the input signal, the imbalance calculator is configured to: perform a triangular function on the input signal to generate a triangular value; and cross correlate the triangular value to generate the cross correlation signal.

Example 20 is the subject matter of Example 19, wherein the input signal is a quadrature modulated signal having an in-phase (I) component and an in-quadrature (Q) component, the performing the triangular function on the input signal including determining a triangular function on the I component and a triangular function on the Q component to generate the triangular value.

Example 21 is the subject matter of any of Examples 13-16, wherein the gradient value is a slope of a cross correlation of the input signal.

Example 22 is the subject matter of Example 21, wherein the input signal is a quadrature modulated signal having an in-phase (I) component and an in-quadrature (Q) component, the cross correlation of the input signal comprising cross correlating a triangular function of the I component with a triangular function of the Q component.

Example 23 is the subject matter of any of Examples 13-22, wherein the input signal is a quadrature modulated signal having an in-phase (I) component and an in-quadrature (Q) component.

Example 24 is a wireless communication device comprising the demodulator of any of Examples 13-23.

Example 25 is an apparatus comprising means to perform the operations of any of Examples 1-11.

Example 26 is a demodulator comprising: phase shifting means for phase shifting an input signal to generate a set of phase-shifted values; mixing means for mixing the set of phased-shifted values and the input signal to generate a respective set of mixed signals; and imbalance calculating means configured to calculate a phase error based on the set of mixed signals and a gradient value.

Example 27 is the subject matter of Example 26, wherein phase shifting means is configured to phase shift the input signal by multiples of a phase shift value to generate the set of phase-shifted signals.

Example 28 is the subject matter of any of Examples 26-27, wherein the mixing means is configured to multiply each phase-shifted value of the set of phase-shifted values by the input signal to generate respective mixed signal values that form the set of mixed signals set of mixed signals.

Example 29 is the subject matter of any of Examples 26-28, wherein the mixing comprises down converting the set of phase-shifted values by the input signal.

Example 30 is the subject matter of any of Examples 26-29, wherein the imbalance calculating means is further configured to cross correlate the input signal to determine a cross correlation signal.

Example 31 is the subject matter of Example 30, wherein the gradient value is a slope of the cross correlation signal.

Example 32 is the subject matter of Example 30, wherein, to cross correlate the input signal, the imbalance calculating means is configured to: perform a triangular function on the input signal to generate a triangular value; and cross correlate the triangular value to generate the cross correlation signal.

Example 33 is the subject matter of Example 32, wherein the input signal is a quadrature modulated signal having an in-phase (I) component and an in-quadrature (Q) component, the performing the triangular function on the input signal including determining a triangular function on the I component and a triangular function on the Q component to generate the triangular value.

Example 34 is the subject matter of any of Examples 26-28, wherein the gradient value is a slope of a cross correlation of the input signal.

Example 35 is the subject matter of Example 34, wherein the input signal is a quadrature modulated signal having an in-phase (I) component and an in-quadrature (Q) component, the cross correlation of the input signal comprising cross correlating a triangular function of the I component with a triangular function of the Q component.

Example 36 is the subject matter of any of Examples 26-35, wherein the input signal is a quadrature modulated signal having an in-phase (I) component and an in-quadrature (Q) component.

Example 37 is an apparatus substantially as shown and described.

Example 38 is a method substantially as shown and described.

CONCLUSION

The aforementioned description of the specific aspects will so fully reveal the general nature of the disclosure that others can, by applying knowledge within the skill of the art, readily modify and/or adapt for various applications such specific aspects, without undue experimentation, and without departing from the general concept of the present disclosure. Therefore, such adaptations and modifications are intended to be within the meaning and range of equivalents of the disclosed aspects, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

References in the specification to "one aspect," "an aspect," "an exemplary aspect," etc., indicate that the aspect described may include a particular feature, structure, or characteristic, but every aspect may not necessarily include the particular feature, structure, or characteristic. Moreover, such phrases are not necessarily referring to the same aspect. Further, when a particular feature, structure, or characteristic is described in connection with an aspect, it is submitted that it is within the knowledge of one skilled in the art to affect such feature, structure, or characteristic in connection with other aspects whether or not explicitly described.

The exemplary aspects described herein are provided for illustrative purposes, and are not limiting. Other exemplary aspects are possible, and modifications may be made to the exemplary aspects. Therefore, the specification is not meant to limit the disclosure. Rather, the scope of the disclosure is defined only in accordance with the following claims and their equivalents.

Aspects may be implemented in hardware (e.g., circuits), firmware, software, or any combination thereof. Aspects may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

For the purposes of this discussion, the term "processor circuitry" shall be understood to be circuit(s), processor(s), logic, or a combination thereof. For example, a circuit includes an analog circuit, a digital circuit, state machine logic, other structural electronic hardware, or a combination thereof. A processor includes a microprocessor, a digital signal processor (DSP), central processing unit (CPU), application-specific instruction set processor (ASIP), graphics and/or image processor, multi-core processor, or other hardware processor. The processor can be "hard-coded" with instructions to perform corresponding function(s) according to aspects described herein. Alternatively, the processor can access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary aspects described herein, processor circuitry can include memory that stores data and/or instructions. The memory can be any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

As will be apparent to a person of ordinary skill in the art based on the teachings herein, exemplary aspects are not limited to communication protocols that utilize the millimeter wave (mmWave) spectrum (e.g., 24 GHz-300 GHz), such as WiGig (IEEE 802.11ad and/or IEEE 802.11ay) which operates at 60 GHz, and/or one or more 5G protocols using, for example, the 28 GHz frequency spectrum. The exemplary aspects can be applied to other wireless communication protocols/standards (e.g., LTE or other cellular protocols, other IEEE 802.11 protocols, etc.) as would be understood by one of ordinary skill in the relevant arts.

What is claimed is:

1. A phase error detection method, comprising:
   phase shifting an input signal to generate a set of phase-shifted values;
   mixing the set of phased-shifted values and the input signal to generate a respective set of mixed signals;
   cross correlating the set of mixed signals to determine a cross correlation signal; and
   calculating a phase error based on the cross correlation signal and a gradient value associated with the cross correlation signal.

2. The method of claim 1, wherein phase shifting the input signal comprises phase shifting the input signal by multiples of a phase shift value to generate the set of phase-shifted signals.

3. The method of claim 1, wherein mixing the set of phased-shifted signals and the input signal comprises multiplying each phase-shifted value of the set of phase-shifted values by the input signal to generate respective mixed signal values that form the set of mixed signals set of mixed signals.

4. The method of claim 1, wherein the mixing comprises down converting the set of phase-shifted values by the input signal.

5. The method of claim 1, wherein the gradient value is a slope of the cross correlation signal.

6. The method of claim 1, wherein the mixing comprises:
   performing a triangular function on the input signal to generate a triangular value; and
   cross correlating the triangular value to generate the cross correlation signal.

7. The method of claim 1, wherein the input signal is a quadrature modulated signal having an in-phase (I) component and an in-quadrature (Q) component, the set of mixed signals corresponding to a triangular function of the I component and a triangular function of the Q component.

8. The method of claim 1, wherein the input signal is a quadrature modulated signal having an in-phase (I) component and an in-quadrature (Q) component.

9. A non-transitory computer-readable storage medium with an executable program stored thereon, when executed, causes a processor to perform the method of claim 1.

10. The method of claim 1, wherein the mixed signals of the set of mixed signals are triangle-wave signals.

11. The method of claim 1, wherein the set of mixed signals correspond to a triangular function of the input signal.

12. The method of claim 1, wherein the set of phased-shifted values and the input signal are square-wave signals, the mixing of the set of phased-shifted values and the input signal generates the respective set of mixed signals as triangle-wave signals.

13. The method of claim 1, wherein the calculated phase error is a function of the cross correlation signal and the gradient value.

14. The method of claim 13, wherein the gradient value is a slope of the cross correlation signal.

15. The method of claim 1, wherein calculating the phase error comprises dividing the cross correlation signal by the gradient value.

16. The method of claim 15, wherein the gradient value is a slope of the cross correlation signal.

17. A demodulator comprising:
- a phase shifter configured to phase shift an input signal to generate a set of phase-shifted values;
- a mixer configured to mix the set of phased-shifted values and the input signal to generate a respective set of mixed signals; and
- an imbalance calculator configured to:
  - cross correlate the set of mixed signals to determine a cross correlation signal; and
  - calculate a phase error based on the cross correlation signal and a gradient value associated with the cross correlation signal.

18. The demodulator of claim 17, wherein phase shifter is configured to phase shift the input signal by multiples of a phase shift value to generate the set of phase-shifted signals.

19. The demodulator of claim 17, wherein the mixer is configured to multiply each phase-shifted value of the set of phase-shifted values by the input signal to generate respective mixed signal values that form the set of mixed signals set of mixed signals.

20. The demodulator of claim 17, wherein the mixing comprises down converting the set of phase-shifted values by the input signal.

21. The demodulator of claim 17, wherein the gradient value is a slope of the cross correlation signal.

22. The demodulator of claim 17, wherein the input signal is a quadrature modulated signal having an in-phase (I) component and an in-quadrature (Q) component, the set of the mixed signals corresponding a triangular function of the I component and a triangular function of the Q component to generate the triangular value.

23. The demodulator of claim 17, wherein the input signal is a quadrature modulated signal having an in-phase (I) component and an in-quadrature (Q) component.

24. A wireless communication device comprising the demodulator of claim 17.

* * * * *